(12) United States Patent
Boon et al.

(10) Patent No.: US 6,316,829 B1
(45) Date of Patent: *Nov. 13, 2001

(54) REINFORCED SEMICONDUCTOR PACKAGE

(75) Inventors: Suan-Jong Jae Boon; Jing Sua Goh, both of Singapore (SG)

(73) Assignee: Texas Instruments Incorporated, Dallas, TX (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/167,642

(22) Filed: Oct. 6, 1998

(30) Foreign Application Priority Data

Jun. 18, 1998 (SG) .................................... 9801463

(51) Int. Cl.[7] .............................. H01L 23/28; H01L 23/04
(52) U.S. Cl. ..................... 257/730; 257/673; 257/644; 257/684; 257/794; 257/712; 257/787
(58) Field of Search ................................. 257/730, 712, 257/684, 796, 670, 646, 673, 787

(56) References Cited

U.S. PATENT DOCUMENTS

| | | | | |
|---|---|---|---|---|
| 5,309,026 | * | 5/1994 | Matsumoto | 257/787 |
| 5,466,887 | * | 11/1995 | Hasegawa | 174/52.2 |

FOREIGN PATENT DOCUMENTS

| | | | | |
|---|---|---|---|---|
| 62-081735 | * | 4/1987 | (JP) . | |
| 2-074055 | * | 3/1990 | (JP) | 257/730 |
| 2-128452 | * | 5/1990 | (JP) | 257/730 |
| 3-149857 | * | 6/1991 | (JP) | 257/730 |
| 4-188854 | * | 7/1992 | (JP) | 257/730 |
| 5-063111 | * | 3/1993 | (JP) | 257/730 |
| 5-144982 | * | 6/1993 | (JP) | 257/730 |

* cited by examiner

*Primary Examiner*—Alexander O. Williams
(74) *Attorney, Agent, or Firm*—Jacqueline J. Garner; Wade James Brady, III; Frederick J. Telecky, Jr.

(57) ABSTRACT

A reinforced semiconductor package (20,30) and method utilizes at least one of the grooves (15,16) and ridges (24,25) formed on the package body (17,23) to reinforce the package body (17,23) to prevent warping of the package after molding.

12 Claims, 3 Drawing Sheets

REINFORCED SEMICONDUCTOR PACKAGE

FIELD OF THE INVENTION

The invention relates to semiconductor devices, and more particularly to molded semiconductor packages reinforced to prevent package warping.

BACKGROUND OF THE INVENTION

Semiconductor packages which have encapsulant-rich areas have a tendency to warp due to shrinkage of the encapsulant. After encapsulation, the inner encapsulant material is often hotter than the material on the surface of the package. This results in contraction of the hotter material which pulls the surface toward it, causing deformation, and often in the form of package warpage. Contraction of the material resultant warpage induces high internal stress. Thin integrated circuit packages are especially susceptible to warping after the encapsulation/molding process. This is particularly true for thin surface mount packages. Warped surface mount packages are rejected since the warpage causes some of the leads to deflect from the mounting plane of the leads causing uneven lead planarity.

SUMMARY OF THE INVENTION

A reinforced semiconductor package and method utilizes at least one of grooves and ridges formed on the package body to reinforce a thin package body to prevent warping of the package after molding or package formation. In one embodiment, grooves are formed in the surface of the package body, and in another embodiment ridges are formed on the surface of the package body. A combination of grooves and ridges may be used to reinforce the package body.

DESCRIPTION OF A PREFERRED EMBODIMENT

Figure 1:
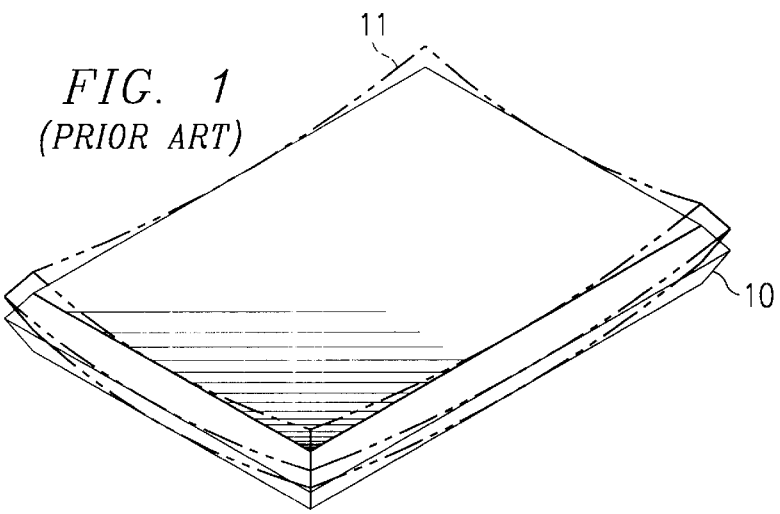
FIG. 1 shows a prior semiconductor package and package warp outline.

FIG. 1 shows a prior art package 10 (without leads) with possible warping shown in dashed lines 11. Such warpage of semiconductor packages is commonly seen after encapsulation, particularly plastic encapsulation. This warpage may not impair the operation of the semiconductor device, but the package cannot be trim formed and uneven lead planarity caused by the warpage makes surface mounting difficult if not impossible.

Warping can be eliminated by structurally reinforcing the semiconductor package. Specific structural reinforcing features depend upon the design of the semiconductor package and may vary in size, shape and number of reinforcing features. A typical application can be applied to Lead-On-Chip (LOC) devices which sometimes have uneven top and bottom package thickness. If the top package thickness is much thinner than the bottom, the thicker bottom encapsulating material will have more post-molding shrinkage. This is similar to bi-metallic strips with uneven thickness, the structure will warp. By including structural reinforcing features of the present invention, package warping can be minimized. Structural features such as removing encapsulating material where there is no lead frame or semiconductor chip can reduce warping. Also, by adding reinforcing ridges on the surface of the package, the package can be strengthened to reduce warping. The novel features of the invention are illustrated below in the several figures, but the invention is not limited to the specific structural features illustrated.

Figure 2:
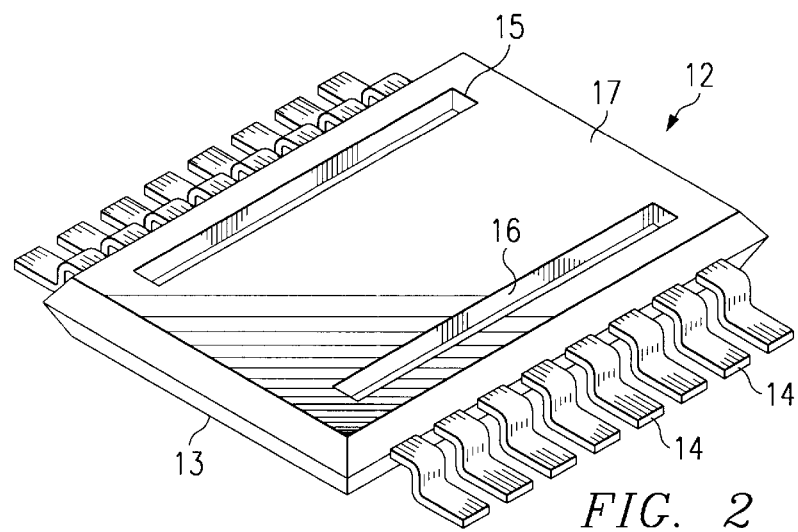
FIG. 2 shows a semiconductor package having reinforcing grooves in the top of the package.

FIG. 2 shows a semiconductor (or integrated circuit) package 12 which has a molded body 13. Leads 14 are shown extending out two sides of body 13, but the package may be, for example, a Quad Flat Package (QFP) with leads extending out four sides of body 13. Two grooves, 15 and 16, are formed in body 13. Grooves or hollow sections 15 and 16 serve as beams within package 12, making it rigid and resistant to warping. The sections 15 and 16 may be formed at the time the package is molded, or a portion of the package may be removed after molding. Grooves 15 and 16 may be parallel to each other, but some may be angled to each other or, at right angles to each other.

Figure 3:
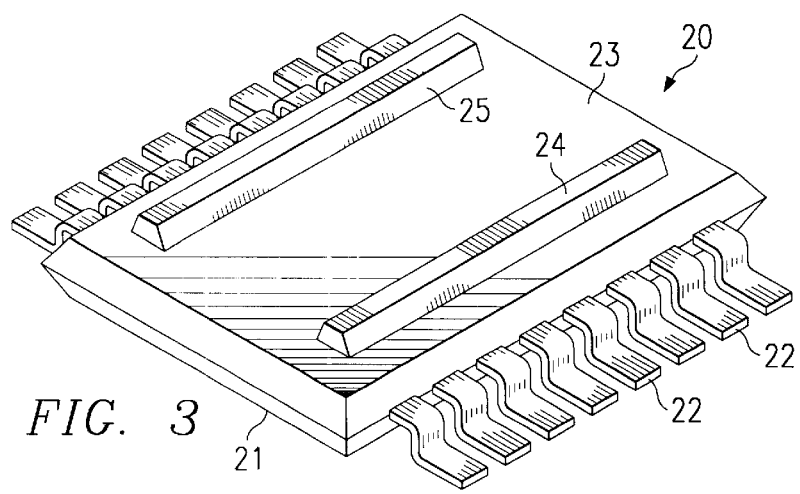
FIG. 3 shows a semiconductor package having raised reinforcing ridges in the top of the package.

FIG. 3 shows a package 20, with body 21, which has protruding ridges 24 and 25 on the surface 23 of body 21. In this embodiment, the protruding ridges 24 and 25 are formed during package molding. As in FIG. 2, leads 22 extend out two sides of the package, but may extend from four sides of body 21. Ridges 24 and 25 provide an additional feature, that of a heat sink. The additional surfaces of ridges 24 and 25 provide additional surface areas to dissipate heat from package 21.

Figure 4:
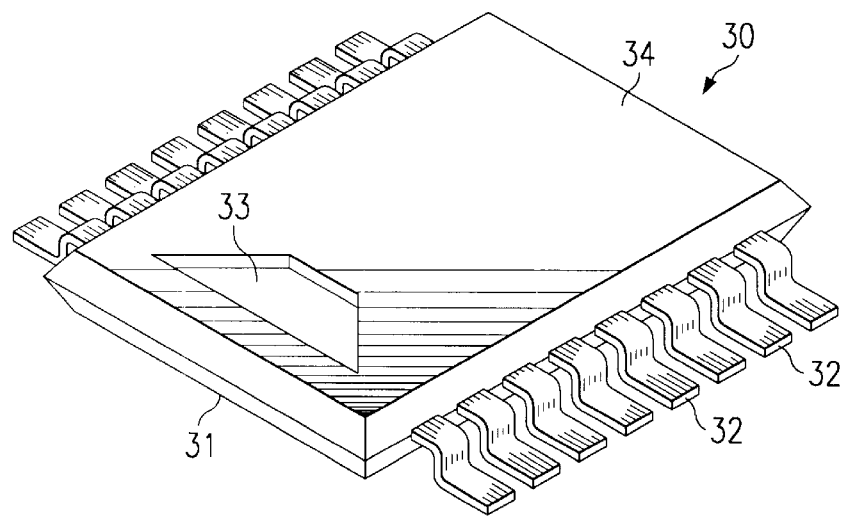
FIG. 4 shows a semiconductor package having a portion of the top surface of the package removed to provide a reinforcing area in the top of the package.

FIG. 4 illustrates an example of a different type of recessed area. In this example, package 30 has a body 31 in which an area 33 has been removed from surface 34. Recessed area is shown in one end of package 30 where encapsulating material extends completely through the package. A second recess, not illustrated, may be formed on the opposite end of the package. Recesses may be formed on either side, top or bottom of the package.

Figure 5:
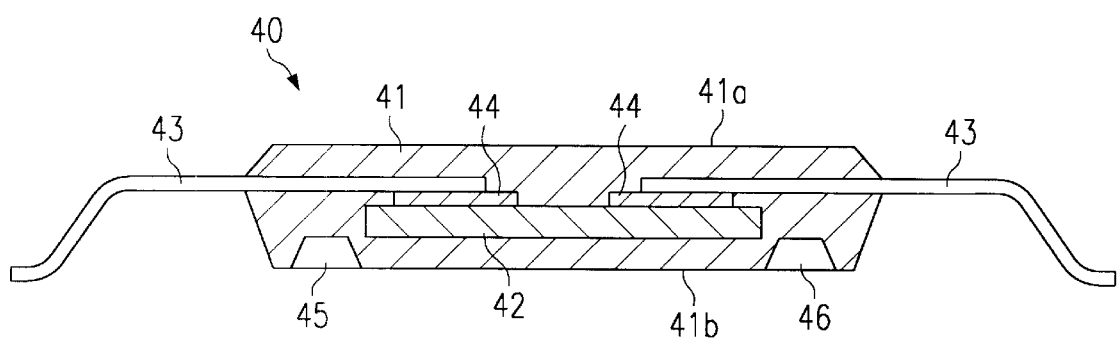
FIG. 5 is a cross-sectional view of a semiconductor package showing reinforcing grooves in one surface of the package.

FIG. 5 shows a cross-section view of an LOC (Lead-On-Chip) device 40 including body 41, chip 42 and leads 43 mounted over chip 42, but insulated therefrom by tape 44. Connections, not illustrated, may be bond wires or by vias through insulating tape 44. Two grooves 45 and 46 are formed in the bottom side 41b of body 41. Groves 45 and 46 extend a portion of the length of body 41 under leads 43.

Figure 6:
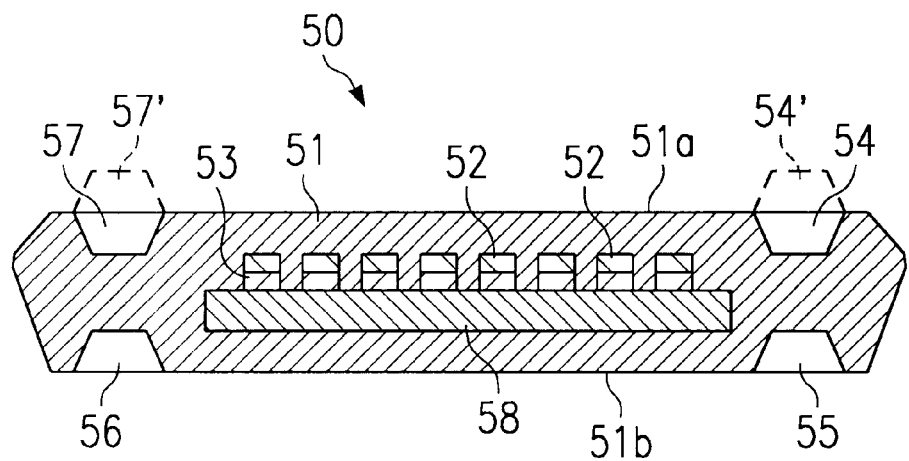
FIG. 6 is a cross-sectional view of a semiconductor package showing reinforcing grooves in two surfaces of the package.

FIG. 6 is a cross-sectional view of a semiconductor device 50 having a body 51, semiconductor chip 58, and leads 52. In this embodiment, there are two grooves 54 and 57 in the top 51a of body 51 and two grooves 55 and 56 in the bottom 55b of body 51. grooves 54–57 are transverse to the grooves 45 and 46 of FIG. 5.

Figure 7:
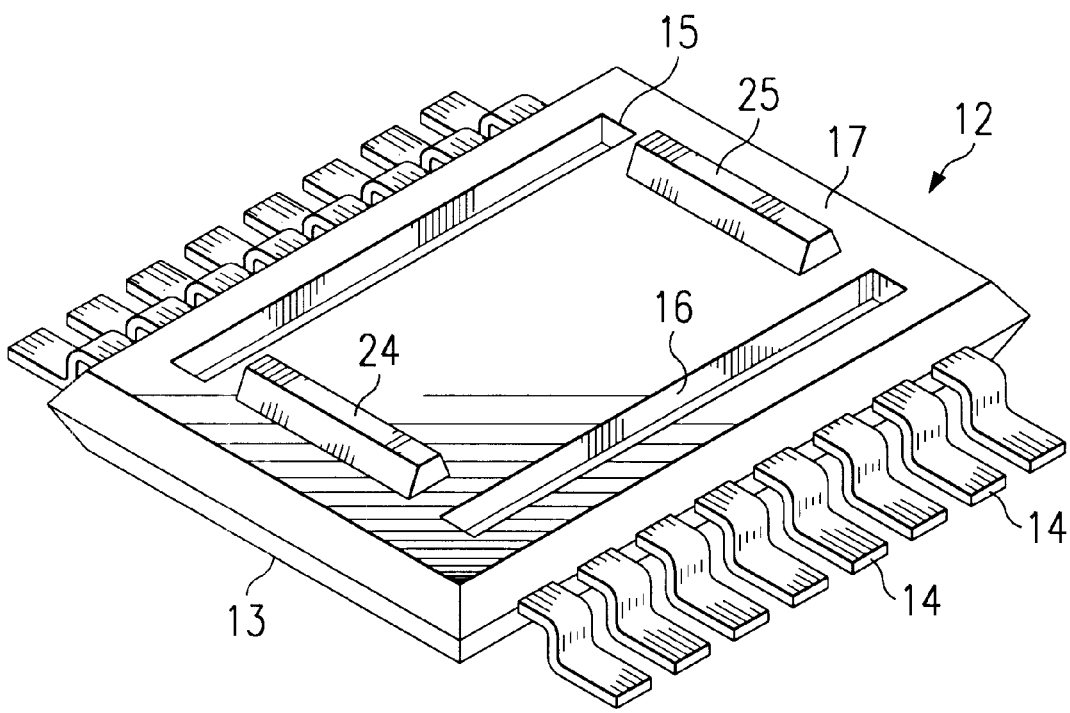
FIG. 7 is a cross-sectional view of a semiconductor package showing both reinforcing grooves and reinforcing ridges.

FIG. 7 is a cross section view of a semiconductor package 12 as shown in FIG. 2 and identical with FIG. 2 except that protruding ridges 24 and 25 have been added as discussed with reference to FIG. 3. A variation of this embodiment would have ridges 54 and 57 in place of grooves 54 and 57.

By stiffening the overall package of thin semiconductor device package, warping can be reduced and internal stress is reduced providing dimensional stability at high operating temperatures. Another advantage is the reduction of encapsulating material per package where grooves are formed in the package. Wire-sweep is minimized by redirecting encapsulating melt flow.

What is claimed is:

1. A reinforced semiconductor package, comprising:

a semiconductor die and leads encapsulated in packaging material, said packaging material defining a pair of opposed major surface;

reinforcing and heat sinking ridges disposed in the packaging material and extending outwardly from at least one of said pair Of opposed major surfaces; and reinforcing grooves disposed in at least one of said pair of opposed major surfaces of the package and extending into said package from said at least one of said major surfaces.

2. The package according to claim 1, wherein said grooves and said ridges are formed parallel to each other.

3. A reinforced semiconductor package, comprising:

a semiconductor die and leads encapsulated in packaging material, said packaging material defining a pair of opposed major surfaces with regions of said packaging material extending between said opposed major surfaces along a line normal to said opposed major surfaces uninterrupted by a said semiconductor die or one of said leads; and at least a first groove in a said region extending to at least one of said opposed major surfaces in one of said regions of said packaging material, said at least a first groove extending between said opposed major surfaces along a line normal to said opposed major surfaces uninterrupted by a said semiconductor die or one of said leads.

4. A reinforced semiconductor package, comprising:

a semiconductor die and leads encapsulated in packaging material, said packaging material defining a pair of opposed major surfaces with regions of said packaging material extending between said opposed major surfaces along a line normal to said opposed major surfaces uninterrupted by a said semiconductor die or one of said leads; and at least a first groove disposed in one of said opposed major surfaces in one of said regions of said packaging material extending between said opposed major surfaces along a line normal to said opposed major surfaces uninterrupted by a said semiconductor die or one of said leads;

further including at least a second groove disposed in the other of said opposed major surfaces.

5. The package according to claim 3, further including at least a first ridge disposed in said one of said opposed major surfaces, wherein there are a combination of said grooves and ridges in and on said package at least one of said opposed major surfaces.

6. The package according to claim 3, wherein said grooves and said ridges are formed parallel to each other.

7. A reinforced semiconductor package, comprising:

a semiconductor die and leads encapsulated in packaging material, said packaging material defining a pair of opposed major surfaces with regions of said packaging material extending between said opposed major surfaces along a line normal to said opposed major surfaces uninterrupted by a said semiconductor die or one of said leads; and at least a first groove disposed in one of said opposed major surfaces in one of said regions of said packaging material extending between said opposed major surfaces along a line normal to said opposed major surfaces uninterrupted by a said semiconductor die or one of said leads;

wherein said at least a first groove is disposed in a region of said packaging material extending between said surfaces along a line normal to said surfaces uninterrupted by a said die or one of said leads.

8. The package of claim 7 wherein said at least one groove is disposed entirely over said one of said regions of said packaging material extending between said opposed major surfaces along a line normal to said opposed major surfaces uninterrupted by a said semiconductor die or one of said leads.

9. The package of claim 4 wherein said at least a first groove is disposed entirely over said one of said regions of said packaging material extending between said opposed major surfaces along a line normal to said opposed major surfaces uninterrupted by a said semiconductor die or one of said leads.

10. The package of claim 5 wherein said at least one groove is disposed entirely over said one of said regions of said packaging material extending between said opposed major surfaces along a line normal to said opposed major surfaces uninterrupted by a said semiconductor die or one of said leads.

11. The package of claim 6 wherein said at least one groove is disposed entirely over said one of said regions of said packaging material extending between said opposed major surfaces along a line normal to said opposed major surfaces uninterrupted by a said semiconductor die or one of said leads.

12. The package of claim 7 wherein said at least a first groove is disposed entirely over said one of said regions of said packaging material extending between said opposed major surfaces along a line normal to said opposed major surfaces uninterrupted by a said semiconductor die or one of said leads.

* * * * *